(12) United States Patent
Frye et al.

(10) Patent No.: US 8,741,773 B2
(45) Date of Patent: Jun. 3, 2014

(54) NICKEL-SILICIDE FORMATION WITH DIFFERENTIAL PT COMPOSITION

(75) Inventors: Asa Frye, Hopewell Junction, NY (US); Andrew Simon, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 717 days.

(21) Appl. No.: 12/684,144

(22) Filed: Jan. 8, 2010

(65) Prior Publication Data

US 2011/0169058 A1 Jul. 14, 2011

(51) Int. Cl.
*H01L 29/78* (2006.01)

(52) U.S. Cl.
USPC ........... 438/664; 438/655; 438/197; 438/311; 438/513; 438/933; 438/678; 438/682; 438/686; 438/752; 438/753; 257/E21.006; 257/E21.051; 257/E21.077; 257/17; 257/165; 257/182; 257/295; 257/311

(58) Field of Classification Search
USPC ........ 257/E21.006, 51, 77, 17, 165, 182, 295, 257/296, 311; 438/197, 311, 513, 933, 678, 438/682, 686, 752, 753
See application file for complete search history.

(56) References Cited

U.S. PATENT DOCUMENTS

| 6,350,684 | B1 | 2/2002 | Wang et al. | |
|---|---|---|---|---|
| 6,586,320 | B2 | 7/2003 | Wang et al. | |
| 6,632,740 | B1 | 10/2003 | Bertrand et al. | |
| 6,689,687 | B1 | 2/2004 | Bertrand et al. | |
| 7,456,096 | B2 | 11/2008 | Yamauchi et al. | |
| 8,021,982 | B2 * | 9/2011 | Kwon et al. | 438/682 |
| 2009/0114992 | A1 * | 5/2009 | Doris et al. | 257/369 |
| 2009/0127594 | A1 * | 5/2009 | Arunachalam et al. | 257/288 |
| 2010/0193876 | A1 * | 8/2010 | Ramani et al. | 257/377 |

* cited by examiner

*Primary Examiner* — Jerome Jackson, Jr.
*Assistant Examiner* — Bo Fan
(74) *Attorney, Agent, or Firm* — Yuanmin Cai

(57) ABSTRACT

Embodiments of the invention provide a method of forming nickel-silicide. The method may include depositing first and second metal layers over at least one of a gate, a source, and a drain region of a field-effect-transistor (FET) through a physical vapor deposition (PVD) process, wherein the first metal layer is deposited using a first nickel target material containing platinum (Pt), and the second metal layer is deposited on top of the first metal layer using a second nickel target material containing no or less platinum than that in the first nickel target material; and annealing the first and second metal layers covering the FET to form a platinum-containing nickel-silicide layer at a top surface of the gate, source, and drain regions.

14 Claims, 5 Drawing Sheets the present invention will be understood and appreciated more fully from the following detailed description of the invention, taken in conjunction with the accompanying drawings of which:

NICKEL-SILICIDE FORMATION WITH DIFFERENTIAL PT COMPOSITION

FIELD OF THE INVENTION

The present invention relates generally to the field of semiconductor device manufacturing and in particular relates to method of forming nickel-silicide with differential platinum composition.

BACKGROUND OF THE INVENTION

Nickel-silicide (NiSi) is an important and frequently used contact material for semiconductor devices such as field-effect-transistors (FETs), which are usually applied in the source (S), drain (D), and/or gate (G) regions of a FET. On the other hand, while being suitable as a contact material, NiSi is also known as a frequent cause of device defects which may be manifested by NiSi formed underneath masking spacer edges and particularly by NiSi formed in the direction of junction of a FET. These defects, which are classified collectively as encroachment defects hereinafter, have been observed in almost every technology node since 65 nm node, may potentially cause device failure due to S/D-well and/or S/D-gate current leakage. Therefore, NiSi encroachments (such as "pipe" defect and "tunnel"defect as known in the art) have been known as "killer defects" in the process of FET formation.

Based upon past experience, tendency of causing encroachment defects during NiSi formation seems to differ between n-type doped FET (NFET) devices and p-type doped FET (PFET) devices, and between PFET SOI (silicon-on-insulator) devices and PFET eSiGe (embedded SiGe) devices. It has been tried to use a nickel-platinum alloy target material, for example, of Ni5%Pt having about 5% platinum (Pt) (in percentage of atom, same throughout this document) in forming nickel-silicide (more precisely platinum-containing nickel-silicide) for 65 nm node, and the NiSi formed thereby has demonstrated to eradicate the "pipe" defects which were previously characterized as predominant on NFET and PFET SOI devices. At the 45 nm node, significant yield improvement has been achieved by using a Ni10%Pt alloy target material, having a higher 10% platinum (Pt) content, to fix the "tunnel"defects on PFET eSiGe devices which would otherwise be found in conventional NiSi. The "tunnel-"defects in 45 nm node have been known of having significantly larger size/length than the "pipe"defects found in 65 nm node.

Unfortunately, the switch to using higher Pt content nickel-platinum alloy is also accompanied by a resistance penalty that is particularly less forgiving for technologies that integrate eDRAM, where strap resistance and perhaps retention yield is highly sensitive to resistance (Rs) of the silicide. The penalty associated with Rs cannot be easily remedied by, for example, simply increasing the silicide thickness due to the narrow process window that is available for the thickness of NiSi. In addition, the switch to using higher Pt content nickel-platinum alloy is further accompanied by a process tendency of forming partial FUSI (fully silicided) gates which may degrade device drive current. Although a low temperature nickel-silicide formation process was later found to be able to fix the partial FUSI defect, the process caused further increases of silicide resistance. Independent from the above technical concerns, the semiconductor industry has also shown a reluctance to migrate towards a silicide process with higher Pt content due to potential higher cost of the target material.

SUMMARY OF THE INVENTION

In view of the above concerns relating to the current process of NiSi formation, there remains a need for finding a solution that will enable NiSi formation with a wider process window, reduced or less encroachment defectivity, reduced or less partial FUSI formation, minimal silicide resistance penalty, and at a palatable cost.

Embodiment of the invention provides a method of forming nickel-silicide and/or platinum-containing nickel-silicide. The method may include the steps of depositing first and second metal layers over at least one of a gate, a source, and a drain region of a field-effect-transistor (FET) through a physical vapor deposition (PVD) process, wherein the first metal layer is deposited using a first nickel target material containing platinum (Pt), and the second metal layer is deposited on top of the first metal layer using a second nickel target material containing no or less platinum than that in the first nickel target material; and annealing the first and second metal layers covering the FET to form a platinum-containing nickel-silicide layer at a top surface of the gate, source, and drain regions.

According to one embodiment, annealing the first and second metal layers further includes forming the platinum-containing nickel-silicide to have a platinum concentration level that is higher near a bottom surface than near a top surface of the nickel-silicide. In another embodiment, depositing the first and second metal layers further includes depositing the first and second metal layers to have a total thickness within a predefined range. For example, the first metal layer may be deposited to have a thickness between about 30 to 70 percent, preferable between about 30 to 50 percent, of the predefined range. The predefined range is a process window determined by the types of FET covered by the first and second metal layers and the particular process used in forming the nickel-silicide, and in one embodiment is preferably between about 9 nm and 11 nm.

According to another embodiment, annealing the first and second metal layers includes placing the FET under an environment with a temperature ranging from about 280C to about 320C, for a time duration of between about 5 to 30 seconds. In one embodiment, the first target material includes nickel and platinum with the content of platinum ranging from 9 percent to 11 percent measured by atom; and the second target material includes nickel and platinum with a platinum concentration level that is preferably less than half of that of the first target material.

A structure of nickel-silicide formed by the above method is also provided.

BRIEF DESCRIPTION OF THE DRAWINGS

The present invention will be understood and appreciated more fully from the following detailed description of the invention, taken in conjunction with the accompanying drawings of which.

Figure 1:
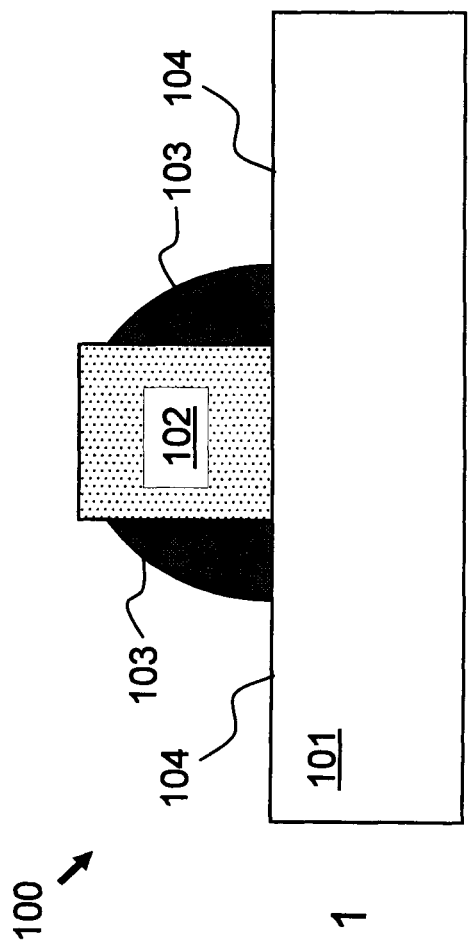
FIGS. 1-4 are demonstrative illustrations of a method of forming NiSi as contact material for a FET according to embodiments of the present invention.

It will be appreciated that for the purpose of simplicity and clarity of illustration, elements in the drawings have not necessarily been drawn to scale. For example, dimensions of some of the elements may be exaggerated relative to other elements for clarity purpose.

DETAILED DESCRIPTION OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or patent applications for reference in order not to obscure description of essences and/or embodiments of the invention. It is to be understood that the following descriptions have rather focused on distinctive features and/or elements of various embodiments of the invention.

It has been observed that adding a certain amount of platinum (Pt) in the process of forming nickel-silicide (NiSi) may reduce or eliminate encroachment defects, such as pipe defects and/or tunnel defects in different technology nodes, and increase thermal stability of the agglomeration. On the other hand, sheet resistance of the NiSi formed thereby may increase with the amount Pt being added. It is discovered and/or observed during the course of present invention that, during the process of forming NiSi, a certain amount of Pt may have segregated to the top surface of formed nickel-silicide as well as to the interface region between formed nickel-silicide and the silicon (Si) material underneath. While Pt at the nickel-silicide and silicon interface provides solution to the suppression of encroachment defects; Pt at the top surface of NiSi contributes to the increased silicide Rs.

According to embodiments of the present invention, the amount of Pt content in the upper portion of the formed silicide, in particular around the top surface thereof, may be reduced, thereby reducing the overall silicide resistance. A two step deposition process may be used in depositing target materials on top of a semiconductor device whereupon nickel-silicide is to be formed. The first step is the deposition of nickel with relatively high Pt content; and the second step is the deposition of nickel with relatively low Pt content. The two step deposition process may create a combined layer of nickel-platinum having a thickness close to the desired thickness as being allowed by the process window.

FIG. 1 is a demonstrative illustration of a method of forming NiSi as contact material for a FET according to one embodiment of the present invention. For example, the method may include forming a basic semiconductor structure 100, such as a field-effect-transistor (FET), which may include for example a semiconductor substrate 101, a gate stack 102 formed on top of semiconductor substrate 101, and spacers 103 formed at the sidewalls of gate stack 102. Semiconductor substrate 101 may be a silicon-containing material such as silicon-on-insulator (SOI) and inside there may be formed source and drain regions 104 that are next to the side of spacers 103. Generally, in order to increase conductivity, conductive contact areas may be further formed on top of gate stack 102 and source/drain regions 104. The conductive contact areas may be formed through a silicidation process of forming nickel-silicide in the source/drain regions, as well as the top of gate stack 102.

Figure 2:
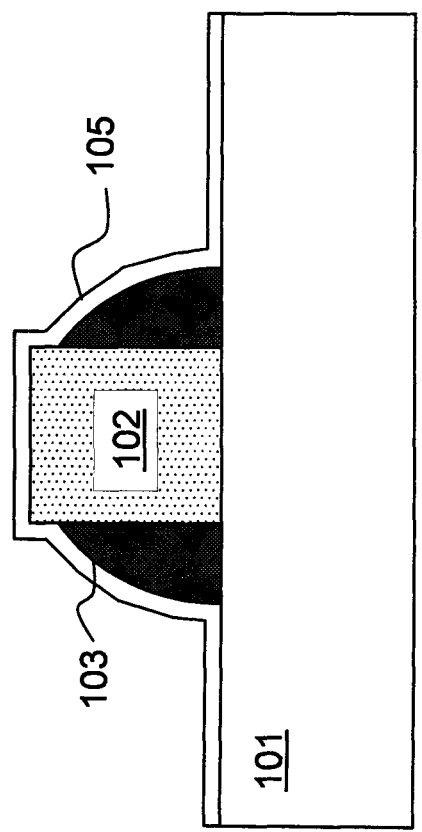

FIG. 2 is a demonstrative illustration of a method of forming NiSi as contact material for a FET according to another embodiment of the present invention following the step shown in FIG. 1. For example, the method may include forming a platinum-containing nickel layer 105 on top of gate stack 102 and source/drain regions 104. The platinum-containing nickel layer 105 may be deposited through a physical vapor deposition (PVD) process onto gate stack 102 and source/drain regions 104 from a target material of nickel alloy, which contains a certain amount of platinum. The selection of amount of platinum contained in the nickel alloy target may be based upon the types of FET devices that the nickel-silicide contact is made for such that, when being formed as nickel-platinum-silicide, the amount of platinum is adequate in curing the encroachment defect of nickel-silicide which would normally be found at the edge of spacers 103 toward the channel region underneath gate stack 102. More specifically, for example, a nickel target material containing 5% platinum (in percentage of atom) may be used for 65 nm FET devices formed on top of bulk Si or SOI, and a nickel target material containing 10% platinum (in percentage of atom) may be used for 45 nm FET devices with embedded SiGe for source and drain contacts. However, embodiments of the present invention are not limited in this aspect, and different variations of Pt content, higher or lower percentage, may be used depending on the actual needs in curing defects and improving thermal stability of the formed nickel-silicide, or more precisely platinum-containing nickel-silicide, and may be determined experimentally.

According to one embodiment of the present invention, thickness of the nickel-platinum layer 105 may be controlled to be less than what is conventionally required for forming nickel-silicide for a particular technology node. For example, conventionally thickness of nickel-platinum, represented by "x", may be around 9 nm to 11 nm, with variations depending upon particular FAB's process integration sensitivities, which is within the allowable process window taking into consideration of sensitivity to defect formation. Nickel-platinum layer 105, according to embodiments of the present invention, may be formed to have preferably 30~70% of the thickness "x", namely around 3 nm to 7 nm. According to one embodiment, the thickness of nickel-platinum layer 105 is made just enough to form sufficient platinum along the interface between formed nickel-silicide and silicon material of source and drain regions to suppress and/or cure potential encroachment phenomenon.

Figure 3:
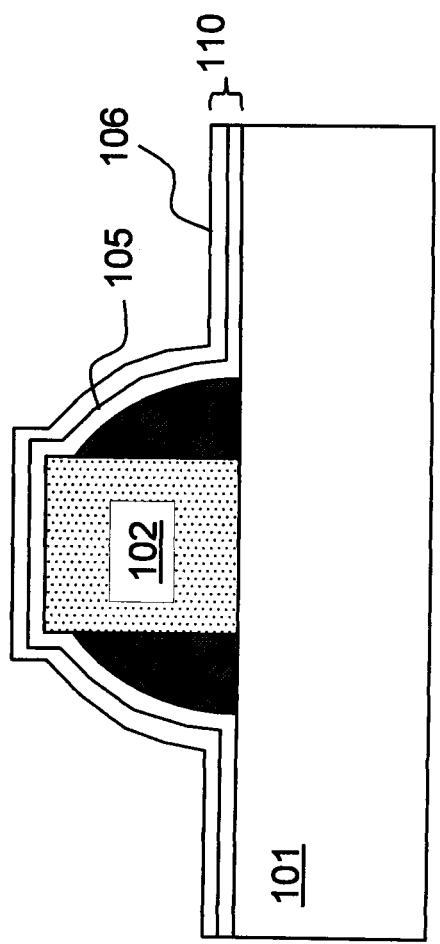

FIG. 3 is a demonstrative illustration of a method of forming NiSi as contact material for a FET according to yet another embodiment of the present invention following the step shown in FIG. 2. For example, embodiment of the method may include forming a metal layer 106 directly on top of platinum-containing layer 105. Metal layer 106 may be a nickel layer and may optionally contain platinum but with a less percentage of Pt content than that of platinum-containing layer 105. Metal layer 106 may be formed through deposition from a target material of nickel alloy containing no or less platinum than the target material used in forming layer 105. Metal layer 106 may be formed in a step following the step of forming layer 105, and possibly using a same deposition chamber with capability of hosting two different target materials. However, platinum-containing layer 105 and metal layer 106 may be formed in two separate chambers each having different target materials and the devices (upon which NiSi is to be formed) may be transferred between the two chambers with minimal exposure to open air or other oxygen-containing environment. The thickness of metal layer 106 may be controlled and/or adjusted such that a combined thickness of layer 105 and layer 106 may be within a process window of thickness for forming nickel-silicide, which is balanced between forming sufficient NiSi while avoiding creating NiSi encroachment, and may be determined experimentally based upon the type of devices being made and particular process conditions.

Figure 4:
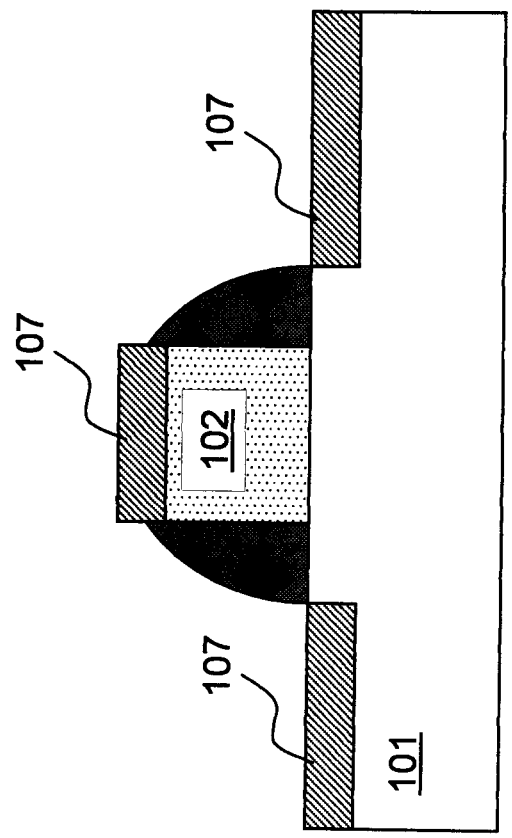

Following the formation of two distinct metal layers 105 and 106, which contain different percentage of Pt content and have a combined thickness that is comparable to what is conventionally required for forming nickel-silicide, semiconductor device 100 may be subjected to an annealing process under a temperature which ranges from about 240 C to about 360 C and preferably from about 280 C to about 320 C. The elevated temperature environment will cause nickel and platinum to diffuse and/or penetrate down into the source and drain regions 104, and create silicide 107 at the top portions of source and drain regions 104, as is demonstratively illustrated in FIG. 4. The annealing process may last for a time-duration of about 2 to 60 seconds, and preferably about 5 to 30 seconds, and thereby creating a silicide at the top of gate stack 102.

Figure 5:
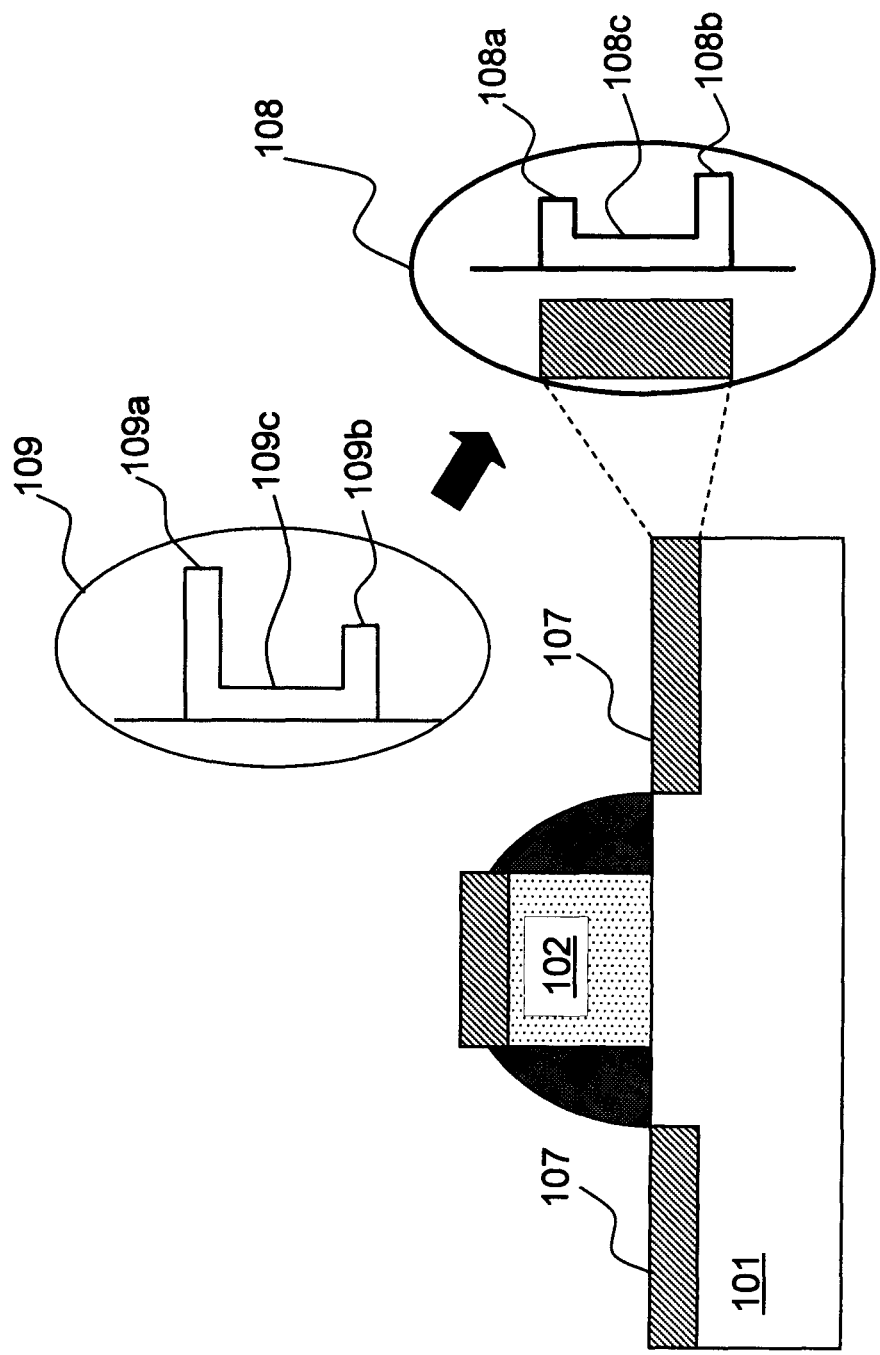
FIG. 5 is a demonstrative illustration of a NiSi contact layer formed with differential platinum composition according to one embodiment of the present invention.

Because the combined metal layer 110 (FIG. 3) has a platinum concentration level that is higher in the lower portion (105) than in the upper portion (106), when being combined with platinum segregation activity as being described above, the annealing of this combined metal layer 110 (formed on top of source, drain and/or gate regions) may create a nickel-silicide layer that has a higher platinum concentration level in the lower portion than in the middle and upper portions. For example, FIG. 5 is a demonstrative illustration of nickel-silicide contact formed according to one embodiment of the present invention. In the exploded portion 108 of FIS. 5, it is illustrated, demonstratively, that silicide 107 may have different platinum concentration levels along the vertical direction. More specifically, platinum concentration level 108a at the upper portion may be higher than that 108c at the middle portion but lower than that 108b at a lower portion. Concentration level of platinum 108c in the middle portion of silicide layer 107 is generally lowest in comparison with that at close to the top surface and at the bottom interface with silicon substrate 101 because of platinum segregation activity as being observed. The above Pt concentration level distribution shall be carefully compared with that of prior art, also illustrated in FIG. 5 at exploded portion 109. It is clear that the high concentration level 109a of Pt at the top surface of silicide 107, which is normally found in nickel-silicide formed using a nickel layer having uniform platinum level and higher than Pt concentration level in the middle and lower portions of silicide 107 as being illustrated in 109, may be reduced to a level that is, in one embodiment, less than that at the nickel-silicide/Si interface.

Here, a person skilled in the art shall appreciate that the drawing is for illustration purpose, and actual distribution of platinum concentration inside nickel-silicide 107 may be slightly different. For example, the Pt distribution may follow a pattern of smooth and gradual change, with highest Pt concentration level 108b being around bottom of silicide layer 107 that interfaces silicon material underneath, gradually changing to a lower concentration level 108c towards the middle of silicide layer 107, and then increasing slightly to level 108a toward the top surface of silicide layer 107.

It has been observed that intermixing and/or reaction of Ni or platinum-containing Ni (NiPt) occurs upon deposition. The degree of this intermixing/reaction may be dependent upon where the Ni or NiPt is deposited and therefore may be different between NFET and PFET and between PFET eSiGe and PFET on SOI. Similar differences may be expected for Ni or NiPt being deposited on surface of embedded silicon-carbide (eSiC) or other Si containing materials to be used as S/D contacts. The result is that the upper layer of metal deposited may interact differently than the lower layer or may not interact at all with the underneath Si containing material. According to one embodiment of the present invention, Ni generally diffuses faster than Pt such that when there is less Pt or no Pt in the upper layer, upon complete silicide formation there may be less Pt segregation close to the surface of formed nickel-silicide, and any content of Pt would come from the lower layer, which results a concentration level of Pt lower at the top surface than at the bottom interface with Si material.

Generally, as being described above, the thickness of combined layer 110 is controlled within allowed process window and upon completion of annealing, there is negligible unreacted metal left over silicon surface. Nevertheless, any remaining unreacted metal including those over insulating regions (such as STI and spacers) may be etched away using etchant that are well known in the art.

According to embodiments of the present invention, a silicide contact layer formed according to the method described above may have sufficient platinum at the bottom to cure any potential silicide encroachment problems while at the same time have a low enough concentration of platinum at the top surface to cause less penalty associated with the resistance increase due to platinum concentration.

Figure 6:
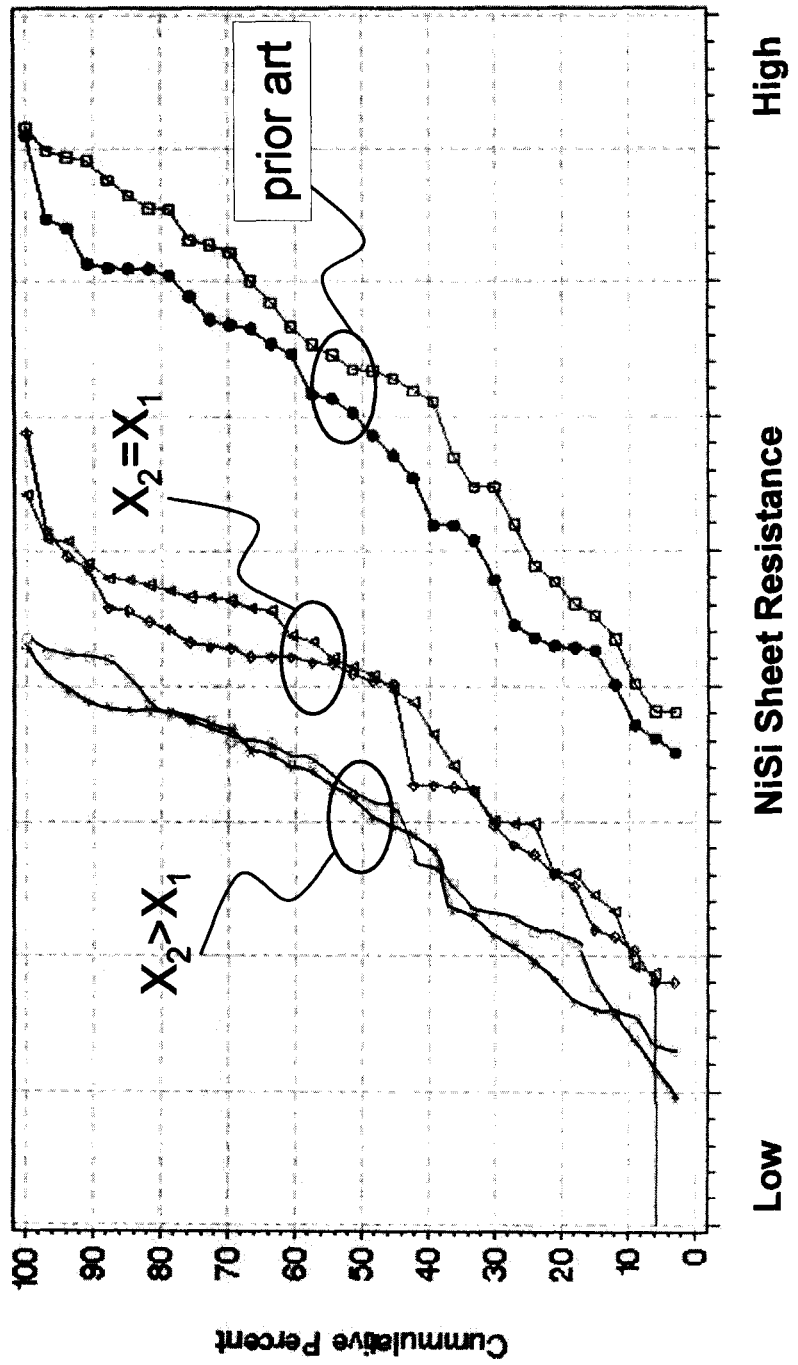
FIG. 6 is a sample chart of measurement results of resistance of NiSi sheet formed under three sets of different process conditions.

FIG. 6 is a sample chart of measurement results of resistance of nickel-silicide (NiSi) sheet formed under three sets of different process conditions. The NiSi sheets were formed either 1) under the prior art condition of using a single NiPt target layer, or 2) using the differential two-layer approach with the top layer having the same thickness as the bottom layer ($X_2=X_1$), or 3) using the differential two-layer approach with the thickness of top layer being larger than that of the bottom layer ($X_2>X_1$). In FIG. 6, X-axis denotes measured resistance of NiSi (in arbitrary unit) and Y-axis denotes cumulative percentage of the total sites measured for each of the process condition. FIG. 6 demonstrates that for any percentage of sites measured, resistance of NiSi formed by the prior art is at the most right side of the chart, indicating higher resistance than other two which were formed according to embodiments of the present invention. In addition, FIG. 6 also demonstrates that resistance of NiSi formed with second layer (106 in FIG. 3) thicker than first layer (105 in FIG. 3) ($X_2>X_1$) using the two-layer approach is less than that using otherwise same thickness of both layers in the two layer approach.

Figure 7:
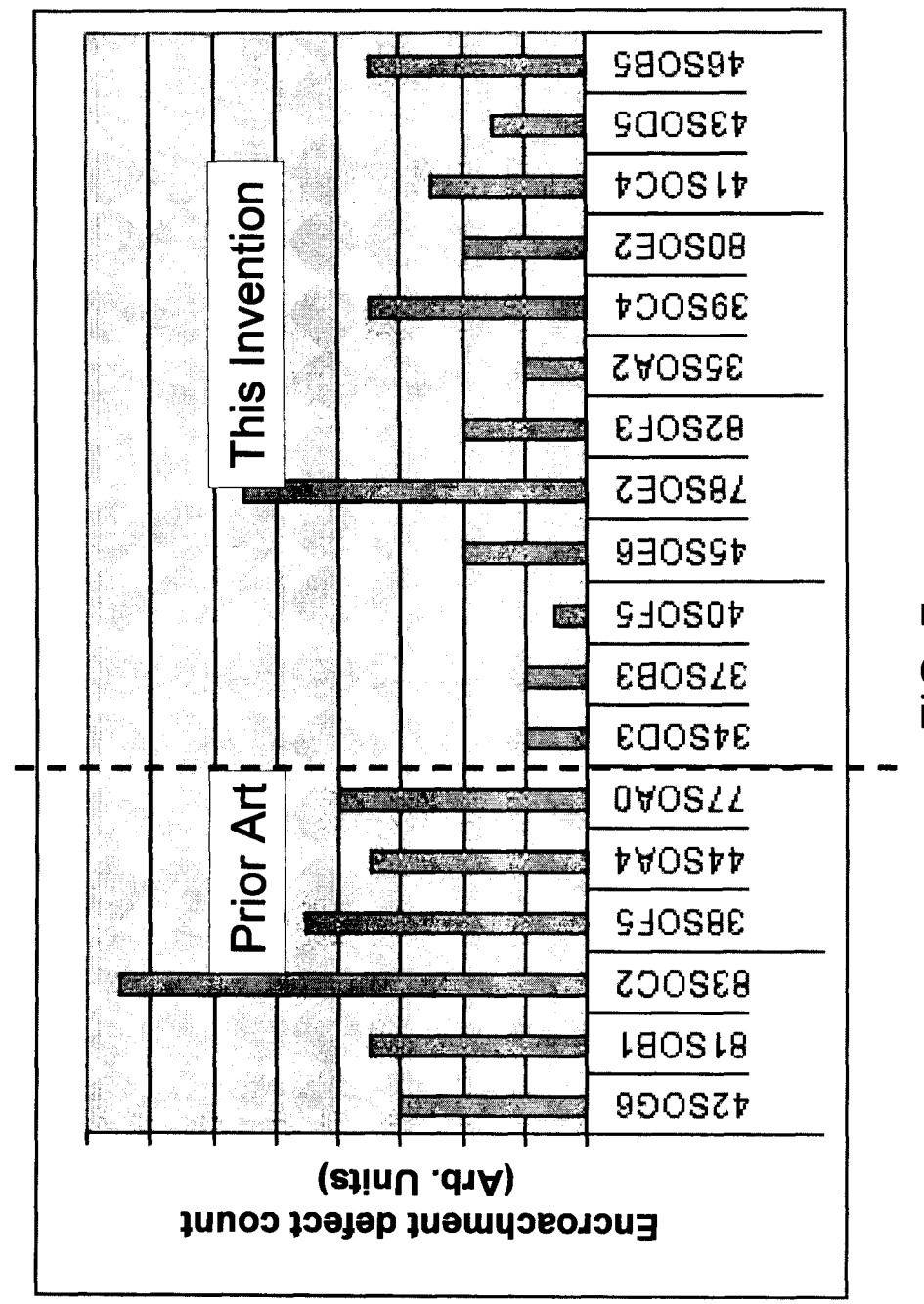
FIG. 7 is a sample chart of test results illustrating improvement in reduced defect counts using processes according to embodiment of present invention.

FIG. 7 is a sample chart of test results illustrating improvement in reduced defect counts using processes according to embodiment of the present invention in forming silicide metal contact for semiconductor devices. In FIG. 7 in the X-axis, different bars represent different wafers. The defect count of silicide encroachment was made by applying automated voltage contrast SEM inspection technique. It is clear from FIG. 7 that the silicide encroachment defect does not increase with a reduction in overall Pt content, which supports the contention that the overall level of Pt concentration is less critical than having sufficient Pt placement at the silicide/Si interface. In fact, FIG. 7 indicates a trend of reduction in average encroachment count with NiSi film being formed using method according to embodiment of the present invention.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
    depositing first and second metal layers over at least one of a gate, a source, and a drain region of a field-effect-transistor (FET) through a physical vapor deposition (PVD) process, wherein said FET is a 45 nm-node FET and the first metal layer is deposited using a first nickel target material comprising nickel and platinum with the content of platinum at 10 percent measured in atom, and the second metal layer is deposited on top of the first metal layer using a second nickel target material containing no or less platinum than that in the first nickel target material; and
    annealing the first and second metal layers covering said FET to form a platinum-containing nickel-silicide layer, at a top surface of said at least one of said gate, source, and drain regions, having a platinum concentration level that is higher near a bottom surface than near a top surface of said nickel-silicide layer and is lower in a middle portion of said nickel-silicide layer than near said top surface of said nickel-silicide layer.

2. The method of claim 1, wherein depositing the first and second metal layers further comprises depositing the first and second metal layers to have a total thickness within a predefined range.

3. The method of claim 2, wherein depositing the first metal layer comprises depositing the first metal layer to have a thickness between about 30 to 70 percent of said predefined range.

4. The method of claim 2, wherein depositing the first metal layer comprises depositing the first metal layer to have a thickness between about 30 to 50 percent of said predefined range.

5. The method of claim 1, wherein the predefined range is a process window determined by a type of the FET covered by the first and second metal layers, and is preferably between about 9 nm and 11 nm.

6. The method of claim 1, wherein annealing the first and second metal layers comprises placing the FET under an environment with a temperature ranging from about 280 C to about 320 C, for a time duration of between about 5 to 30 seconds.

7. The method of claim 1, wherein said second target material comprises nickel and platinum with a platinum concentration level preferably less than half of that of said first target material.

8. A method comprising:
    depositing a first platinum-containing nickel layer over a gate, a source, and a drain region of a field-effect-transistor (FET) using a first nickel target material containing platinum (Pt);
    depositing a second nickel layer on top of the first platinum-containing nickel layer using a second nickel target material; and
    annealing the first and second nickel layers to form a nickel-silicide layer at a top surface of said gate, source, and drain regions, said nickel-silicide having a platinum concentration level that is higher near a bottom surface than near a top surface of said nickel-silicide layer and is lower in a middle portion of said nickel-silicide layer than near said top surface of said nickel-silicide layer,
    wherein said FET is either a 65 nm-node FET with said first nickel target material containing 5% platinum (Pt) measured in atom or a 45 nm-node FET with said first nickel target material containing 10% Pt measured in atom.

9. The method of claim 8, wherein said second nickel layer contains no platinum.

10. The method of claim 8, wherein said second nickel layer contains a concentration level of platinum less than half of that in the first platinum-containing nickel layer.

11. The method of claim 8, wherein depositing the first and second nickel layers further comprises depositing the second nickel layer to have a thickness equal to or larger than a thickness of the first nickel layer while keeping a total thickness of the first and second nickel layers within a predefined range, wherein said predefined range is determined by a type of the FET covered by the first and second nickel layers.

12. The method of claim 11, wherein said predefined range is between about 9 nm to about 11 nm.

13. The method of claim 11, wherein the first nickel layer has a thickness between about 30 to 50 percent of said predefined range.

14. A method comprising:
    depositing first and second metal layers over at least one of a gate, a source, and a drain region of a field-effect-transistor (FET) through a physical vapor deposition (PVD) process, wherein the first metal layer is deposited using a first nickel target material comprising nickel and platinum, and the second metal layer is deposited on top of the first metal layer using a second nickel target material containing no or less platinum than that in the first nickel target material; and
    annealing the first and second metal layers covering said FET to form a platinum-containing nickel-silicide layer, at a top surface of said at least one of said gate, source, and drain regions, said nickel-silicide layer having a platinum concentration level that is higher near a bottom surface than near a top surface of said nickel-silicide layer and is lower in a middle portion of said nickel-silicide layer than near said top surface of said nickel-silicide layer.

* * * * *